(12) United States Patent
Heydari

(10) Patent No.: US 7,637,312 B1
(45) Date of Patent: *Dec. 29, 2009

(54) UNITARY FIELD-REPLACEABLE ACTIVE INTEGRATED LIQUID PUMP HEAT SINK MODULE FOR THERMAL MANAGEMENT OF ELECTRONIC COMPONENTS

(75) Inventor: Ali Heydari, Albany, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 857 days.

This patent is subject to a terminal disclaimer.

(21) Appl. No.: 11/196,905

(22) Filed: Aug. 4, 2005

(51) Int. Cl.
*H05K 7/20* (2006.01)

(52) U.S. Cl. .................. 165/104.33; 165/80.4; 361/699; 361/700

(58) Field of Classification Search .................. 165/80.4, 165/104.33; 257/714; 361/699, 700
See application file for complete search history.

(56) References Cited

U.S. PATENT DOCUMENTS

| | | | |
|---|---|---|---|
| 5,406,807 A * | 4/1995 | Ashiwake et al. | 361/699 |
| 5,763,951 A * | 6/1998 | Hamilton et al. | 257/714 |
| 6,637,231 B1 | 10/2003 | Monfarad | |
| 6,648,064 B1 * | 11/2003 | Hanson | 165/80.4 |
| 6,687,122 B2 | 2/2004 | Monfarad | |
| 6,741,469 B1 | 5/2004 | Monfarad | |
| 7,219,714 B1 * | 5/2007 | Heydari | 165/80.4 |
| 7,222,661 B2 * | 5/2007 | Wei et al. | 165/80.4 |

* cited by examiner

*Primary Examiner*—Leonard R Leo
(74) *Attorney, Agent, or Firm*—Marsh Fischmann & Breyfogle LLP; Kent A. Lembke

(57) ABSTRACT

A field-replaceable active pumped liquid heat sink module includes a liquid pump, a radiator, an optional receiver, and a cold plate heat exchanger, all of which are connected together in a liquid pump loop through which a coolant such as water is circulated. The liquid pump, radiator, optional receiver and cold plate heat exchanger are in a liquid pump loop and are self-contained in a field-replaceable active pumped liquid heat sink module.

19 Claims, 3 Drawing Sheets

UNITARY FIELD-REPLACEABLE ACTIVE INTEGRATED LIQUID PUMP HEAT SINK MODULE FOR THERMAL MANAGEMENT OF ELECTRONIC COMPONENTS

FIELD OF THE INVENTION

The present invention is related to heat sinks for removing heat from electronic components such as integrated circuit processors.

BACKGROUND OF THE INVENTION

Removal of heat has become one of the most important challenging issues facing computer system designers today. As the rate of power dissipation from electronics components such as high performance server processors continues to increase, standard conduction and forced-air convection fan air cooling techniques no longer provide adequate cooling for such sophisticated electronic components. The reliability of the electronic system suffers if high temperatures at hot spot locations are permitted to persist. Conventional thermal control schemes such as air cooling with fans, thermoelectric cooling, heat pipes, and passive vapor chambers have either reached their practical application limit or are soon to become impractical for high power electronic components such as computer server processors. When standard cooling methods are no longer adequate, computer manufacturers have to reduce the frequency of their processors to match the capacity of existing cooling apparatus. Furthermore, reliability can be compromised due to inadequate cooling using an existing cooling apparatus, or product release delayed until a reliable cooling apparatus for removal of heat from high heat dissipating processors can be made available.

The computer industry is seriously considering utilizing active liquid cooling as an alternative to conventional passive air cooling for high performance and high power processors. A number of attempts to incorporate liquid for cooling of high powered processors in the form of submerged liquid, liquid spray cooling, refrigeration cooling, and the like have been attempted in the past, but none of the existing active liquid cooling solutions has been utilized outside of specific design conditions. Additionally, these cooling solutions, while effective, can include a relatively high number of moving parts that can lead to increased product and maintenance costs.

What is desired, therefore, is a field-replaceable heat sink module that employs active liquid cooling, but has the same appearance as a traditional air-cooling heat sink, is sturdy, reliable, compact, simple to use, relatively inexpensive, and can be effectively employed in a wide range of applications.

SUMMARY OF THE INVENTION

According to an embodiment of the present invention, a field and/or customer replaceable integrated active pumped liquid heat sink module is suitable for thermal management of high heat dissipation in electronic components such as server processors. The field-replaceable integrated active pumped liquid heat sink module is self-contained and is specifically designed to have physical dimensions similar to those of a standard air-based cooling system, such as a finned heat sink or a heat pipe. As a result, the field replaceable integrated active liquid-pumped heat sink module can be utilized in existing electronic systems without the need for board or cabinet/rack modification or the "plumbing" associated with prior art liquid-based cooling systems.

According to an embodiment of the present invention, a field-replaceable active pumped liquid heat sink module includes a liquid pump, a radiator, an optional receiver, and a cold plate heat exchanger, all of which are connected together in a liquid pump loop through which a coolant such as water is circulated. The liquid pump, radiator, optional receiver and cold plate heat exchanger are in a liquid pump loop and are self-contained in a field-replaceable active pumped liquid heat sink module.

From the view point of the end user, the entire liquid pump apparatus is hermetically-sealed and contained in the heat sink module and besides the electric wires needed to power up the liquid pump, there is no difference in external appearance of a conventional heat sink and the heat sink module of the current invention. The cold plate heat exchanger can be positioned in thermal contact with a heat source (such as the lid of a processor) of an electronic component, that is to be cooled.

As is understood by those of ordinary skill in the art, a liquid pump pumps the coolant out of a radiator. The heat of the high temperature coolant is removed in the radiator by the air blown by a system fan. In the radiator, the coolant is allowed to cool before being conveyed to a receiver. From the optional receiver, the coolant liquid is drawn back into the pump, out of which the coolant liquid passes into a cold plate heat exchanger. The liquid coolant is heated up in the cold plate heat exchanger and in the process absorbs heat from heat source (such as a server processor) to produce the desired cooling effect. From the radiator heat exchanger the coolant liquid is drawn back into pump to begin another cycle through pumped liquid cycle.

The field-replaceable integrated active-pumped liquid heat sink module of the present invention is a modified liquid-based cooling system and therefore provides the cooling capacity of prior art liquid-based cooling systems. However, unlike prior art liquid-based cooling systems, the field replaceable integrated active liquid pumped heat sink module of the present invention is modular and self-contained and is therefore field and/or customer replaceable with minimal effort using standard tools. In addition, unlike prior art liquid-based cooling systems, the field replaceable integrated active liquid-pumped heat sink module of the present invention is capable of being attached directly to the components (such as processors) that need cooling. In addition the field replaceable integrated active liquid-pumped heat sink module of the present invention is compact and simple in both operation and installation, with minimal parts to fail or break and minimal added complexity. Therefore the field replaceable integrated active liquid pumped heat sink module of the invention is sturdy and reliable.

The foregoing and other features, utilities and advantages of the invention will be apparent from the following more particular description of an embodiment of the invention as illustrated in the accompanying drawings.

DETAILED DESCRIPTION

Figure 1:
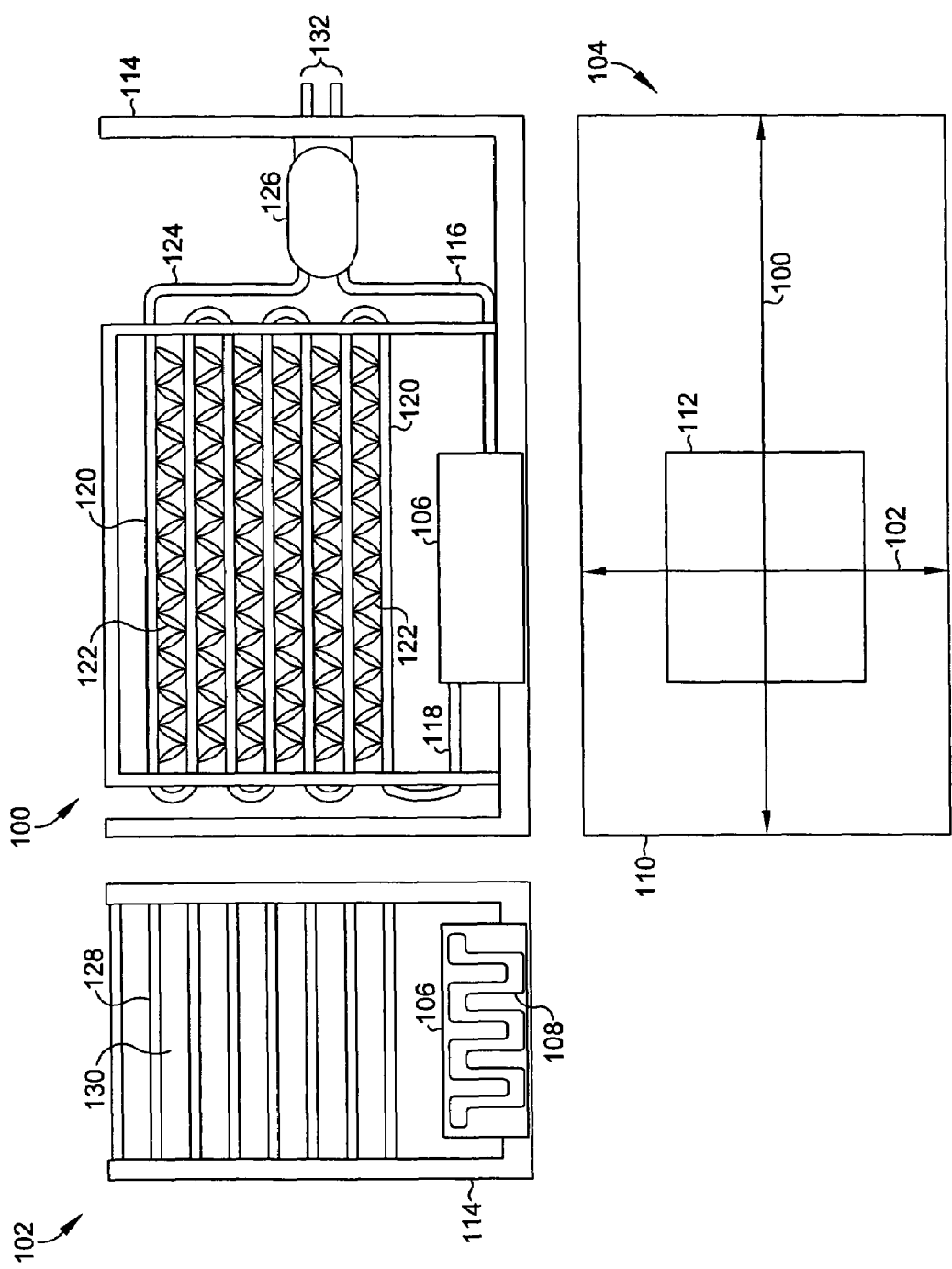
FIG. 1 shows two cross-sectional views and a bottom view of a unitary field-replaceable active integrated liquid pump heat sink module according to an embodiment of the present invention.

Referring now to FIG. 1, a first cross-sectional view 100 of a unitary field-replaceable active integrated liquid pump heat sink module according to an embodiment of the present invention includes a heat sink casing 114, which is typically fabricated out of aluminum, copper, or alloys thereof, or other similar metals or alloys, and is about 0.25 inches thick. The overall dimensions of the heat sink casing are typically about 5.0 inches by 3.0 inches by 1.75 inches in a unitary embodiment or about 7.0 inches by 5.0 inches by 1.75 inches in a multi-component embodiment, but can of course be changed as desired for a particular application. A cold plate heat exchanger 106 is embedded into the heat sink casing 114, such that only a small thickness of material separates the cold plate heat exchanger 106 from the top surface of an integrated circuit processor (not shown in FIG. 1) or other integrated circuit so that the maximum amount of heat can be removed. The remaining thickness at the bottom of the heat sink casing 114 shown in FIG. 1 is between about 2.0 and 5.0 mm, but this range can also be changed as desired for a particular application. Cold plate heat exchangers are known in the art. A suitable cold plate heat exchanger would be a micro-channel heat exchanger, but other such cold plate heat exchangers could also be used. A hot liquid output line 118 is coupled to a radiator heat exchanger 120. The hot liquid output line 118 is fabricated out of copper or aluminum. The dimensions of the hot liquid output line 118 are about 1.5 inches long by about 0.125 inches, outside diameter, but these dimensions are tailored to the form factor of the overall heat sink casing. The wall thickness of the hot liquid output line 118 is between 1.0 and 2.0 mm. The dimensions of the hot liquid output line 118 are maintained for the other liquid lines throughout the radiator heat exchanger 120. The fluid lines in the radiator heat exchanger 120 are separated by a number of radiator fins 122, which are fabricated out of aluminum or copper. The radiator fins 122 can be any dimensions required for a required form factor, but are typically about 4.0 inches long and about 0.125 inches thick. A fluid such as water or a mixture of water and glycol or other such media flows through the lines in the radiator heat exchanger 120, and is gradually cooled without any phase change. The fluid is fully cooled at the uppermost line in the radiator heat exchanger 120 and emerges as the cold liquid return line 124 once fully cooled. In a typical application, the temperature of the fluid in the hot liquid output line 118 could be as high as 110° C., and, with proper air flow from an accompanying fan (not shown in FIG. 1) the temperature of the fluid in the cold liquid return line 124 can be as low as 25° C. The cold liquid return line 124 is coupled to the input port of a liquid pump 126. In accordance with an embodiment of the present invention, the liquid pump 126 is one of several new generation pumps that are relatively small, on the order of 1.5 inches in diameter and 3.0 to 4.0 inches long, although other dimension pumps can of course be used to fit a particular form factor. A suitable pump 126 for the unitary heat sink embodiment shown in FIG. 1 is a brushless miniature spherical pump. A miniature diaphragm pump or a positive displacement pump could also be used. The output port of liquid pump 126 is coupled to the cold liquid input line 116, which in turn is coupled to the input port of the cold plate heat exchanger 106 to complete the closed liquid flow path. Electrical connections 132 are provided to activate the liquid pump 126, which are the only outside connections required by the unitary heat sink module according to the present invention. The liquid pump 126 typically consumes about 10.0 watts of power, and is energized by a 12.0 volt connection and a ground connection. In the multi-component embodiment each liquid pump consumes about 10.0 watts of power.

A second cross-sectional view 102 of a unitary field-replaceable active integrated liquid pump heat sink module according to an embodiment of the present invention is also shown in FIG. 1, which is orthogonal to cross-sectional view 100. Cross-sectional view 102 allows further detail of the heat sink module to be shown. The cross-sectional view of the heat sink casing 114 shows embedded cold plate heat exchanger 106. The cross-sectional view of the cold plate heat exchanger allows a view of the cold plate heat exchanger liquid channel 106. The liquid channel 106 is only a representative view of a slice through cold plate heat exchanger 106 at a particular plane therethrough, and thus the actual ports engaging the hot liquid output line 118 and cold liquid input line 116 are not shown. In cross-sectional view 102, the individual radiator heat exchanger liquid flow channels 128 are visible, as well as a side view of one course of the radiator heat exchanger fin plates 130.

A second bottom view 104 of a unitary field-replaceable active integrated liquid pump heat sink module according to an embodiment of the present invention is also shown in FIG. 1. The bottom view 104 shows the "footprint" of the heat sink base plate 110, as well as the footprint of the cold plate heat exchanger base plate 112, that will reside on top of the lid of the integrated circuit processor or other circuit. Note that in bottom view 104, the actual cold plate heat exchanger base plate 112 is covered by a thin layer of heat sink casing material. Two cross-sectional lines 100 and 102 are shown in the bottom view 104, representing the relative cross-sectional cuts for first and second cross-sectional views 100 and 102.

Figure 2:
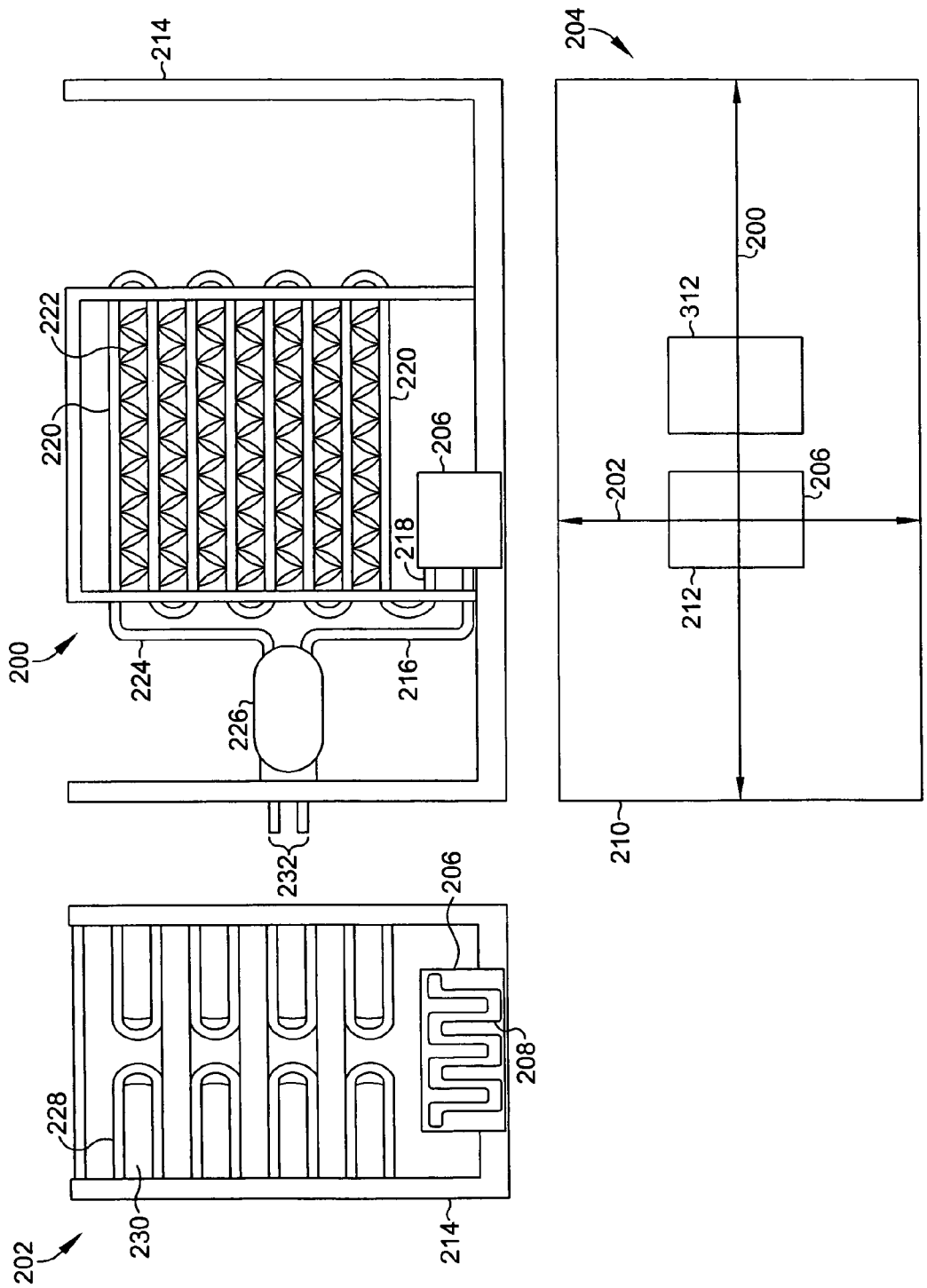
FIG. 2 shows two cross-sectional views and a bottom view of a "front" portion of a multi-component field-replaceable active integrated liquid pump heat sink module according to an embodiment of the present invention.

Referring now generally to FIG. 2, a first portion of a multi-component field-replaceable active integrated liquid pump heat sink module is shown according to an embodiment of the present invention. It is important to note in FIG. 2, that the "100" series of identification numerals referred to in FIG. 1 generally correspond to the "200" series shown in FIG. 2. In addition, the dimensions and selection of the components are generally the same, except as noted below.

Cross-sectional view 200 only depicts the components in the "front" portion of the heat sink module. The components in the "back" portion of the same heat sink module are described below with respect to FIG. 3. Thus, shown in FIG. 2 are the heat sink casing 214, a first cold plate heat exchanger 206 embedded into the heat sink casing 214, such that only a small thickness of material separates the cold plate heat exchanger 206 from the top surface of a first integrated circuit processor (not shown in FIG. 2) or other integrated circuit. A first hot liquid output line 218 is coupled to a first radiator heat exchanger 220. The dimensions of the hot liquid output line 118 are about 1.5 inches long by 0.125 inches, outside diameter, but these dimensions are tailored to the form factor of the overall heat sink casing. Most pertinently, the dimensions are adjusted to make sure that the first radiator heat exchanger 220 and the second radiator heat exchanger 320 (described below) both fit into the same heat sink module. The dimensions of the hot liquid output line 218 are maintained for the remaining fluid lines throughout the radiator heat exchanger 220. The fluid lines in the radiator heat exchanger 220 are separated by a number of radiator fins 222. The cold liquid return line 224 is coupled to the input port of a first liquid pump 226. The output port of the first liquid pump 226 is coupled to the cold liquid input line 216, which in turn is coupled to the input port of the first cold plate heat exchanger 206 to complete the closed liquid flow path. Electrical connections 232 are provided to activate the first liquid pump 226.

A second cross-sectional view 202 of a multi-component field-replaceable active integrated liquid pump heat sink module according to an embodiment of the present invention is also shown in FIG. 2, which is orthogonal to cross-sectional view 200. Cross-sectional view 202 allows further detail of the heat sink module to be shown. The cross-sectional view of the heat sink casing 214 shows embedded cold plate heat exchanger 206. The cross-sectional view of the cold plate heat exchanger allows a view of the cold plate heat exchanger liquid channel 206. In cross-sectional view 202, the individual radiator heat exchanger liquid flow channels 228 are visible, as well as a side view of one course of the radiator heat exchanger fin plates 230. There are two sets of liquid flow channels and fin plates visible in cross-sectional view 202 corresponding to the components in the front and back portions multi-component heat sink module.

A second bottom view 204 of the multi-component field-replaceable active integrated liquid pump heat sink module according to an embodiment of the present invention is also shown in FIG. 2. The bottom view 204 shows the footprint of the heat sink base plate 210, as well as the footprint of the first and second cold plate heat exchanger base plates 212 and 312, that will reside on top of the lids of two integrated circuit processors or other circuits. Two cross-sectional lines 200 and 202 are shown in the bottom view 204, representing the relative cross-sectional cuts for first and second cross-sectional views 200 and 202. It is important to note that cross-sectional line 200 may have to be adjusted up or down in bottom view 204 to provide the cross-sectional views actually shown in FIGS. 2 and 3. This adjustment may be necessary due to the exact physical placement of liquid pumps 226 and 326 within the heat sink module.

Figure 3:
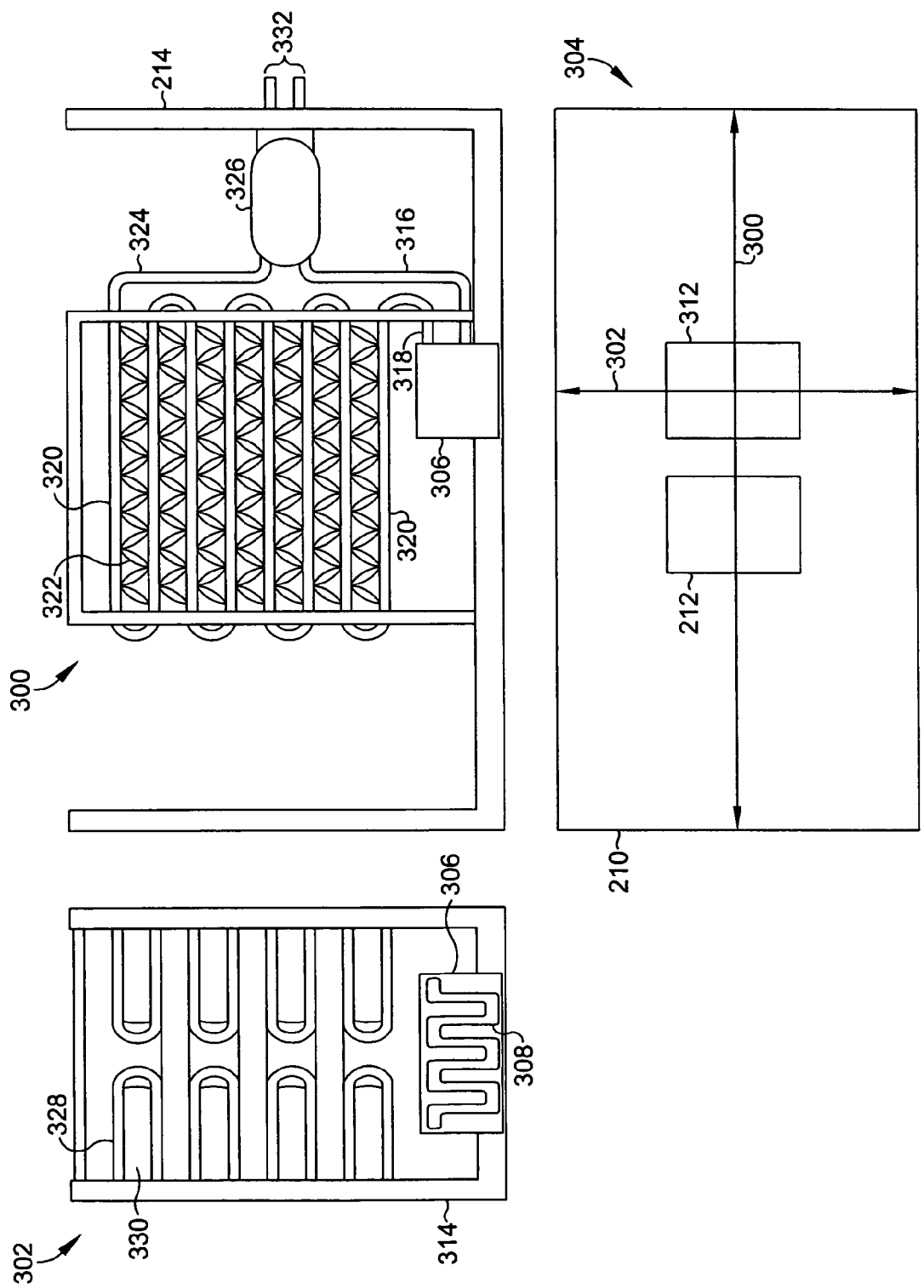
FIG. 3 shows two cross-sectional views and a bottom view of a "back" portion of a multi-component field-replaceable active integrated liquid pump heat sink module according to an embodiment of the present invention.

Referring now generally to FIG. 3, a second portion of a multi-component field-replaceable active integrated liquid pump heat sink module is shown according to an embodiment of the present invention. It is important to note in FIG. 3, that the "100" series of identification numerals referred to in FIG. 1 generally correspond to the "300" series shown in FIG. 3. In addition, the dimensions and selection of the components are generally the same, except for the same shared heat sink casing 214 and the same shared heat sink base plate 210, and as noted below.

Cross-sectional view 300 only depicts the components in the "back" portion of the heat sink module. Thus, shown in FIG. 3 are the heat sink casing 314, a second cold plate heat exchanger 306 embedded into the heat sink casing 314, such that only a small thickness of material separates the cold plate heat exchanger 206 from the top surface of a second integrated circuit processor (not shown in FIG. 3) or other integrated circuit. A second hot liquid output line 318 is coupled to a second radiator heat exchanger 320. The fluid lines in the radiator heat exchanger 320 are separated by a number of radiator fins 322. The cold liquid return line 324 is coupled to the input port of a second liquid pump 326. The output port of the second liquid pump 326 is coupled to the cold liquid input line 316, which in turn is coupled to the input port of the second cold plate heat exchanger 306 to complete the closed liquid flow path. Electrical connections 332 are provided to activate the first liquid pump 326.

A second cross-sectional view 302 of a multi-component field-replaceable active integrated liquid pump heat sink module according to an embodiment of the present invention is also shown in FIG. 3, which is orthogonal to cross-sectional view 300. The cross-sectional view of the heat sink casing 214 shows a second embedded cold plate heat exchanger 306. The cross-sectional view of the cold plate heat exchanger allows a view of the cold plate heat exchanger liquid channel 306. In cross-sectional view 302, the individual radiator heat exchanger liquid flow channels 328 are visible, as well as a side view of one course of the radiator heat exchanger fin plates 330. There are two sets of liquid flow channels and fin plates visible in cross-sectional view 302 corresponding to the components in the front and back portions multi-component heat sink module.

A second bottom view 304 of the multi-component field-replaceable active integrated liquid pump heat sink module according to an embodiment of the present invention is also shown in FIG. 3. The bottom view 204 shows the footprint of the heat sink base plate 210, as well as the footprint of the first and second cold plate heat exchanger base plates 212 and 312, that will reside on top of the lids of two integrated circuit processors or other circuits. Two cross-sectional lines 300 and 302 are shown in the bottom view 304, representing the relative cross-sectional cuts for first and second cross-sectional views 200 and 302. It is important to note that cross-sectional line 300 may have to be adjusted up or down in bottom view 304 to provide the cross-sectional views actually shown in FIGS. 2 and 3. This adjustment may be necessary due to the exact physical placement of liquid pumps 226 and 326 within the heat sink module.

While the invention has been particularly shown and described with reference to embodiments thereof, it will be understood by those skilled in the art that various other changes in the form and details may be made without departing from the spirit and scope of the invention. It should be understood that this description has been made by way of example, and that the invention is defined by the scope of the following claims.

I claim:

1. A field-replaceable unitary heat sink module employing active liquid cooling comprising:
    a heat sink casing with a first thickness;
    a radiator heat exchanger including a hot liquid output line and a cold liquid return line;
    a cold plate heat exchanger embedded in the heat sink casing having an input coupled to a cold liquid input line, and an output coupled to the hot liquid output line, wherein the heat sink casing has a second thickness less than the first thickness at a location in which the cold plate heat exchanger is embedded into the heat sink casing; and
    a liquid pump having an input port coupled to the cold liquid return line and an output port coupled to the cold liquid input line, and electrical connections for receiving electrical pump power.

2. The unitary heat sink module of claim 1 wherein the overall dimensions of the heat sink casing are about 5.0 inches by 3.0 inches by 1.75 inches.

3. The unitary heat sink module of claim 1 wherein a remaining thickness at the bottom of the heat sink casing is between about 2.0 and 5.0 mm.

4. The unitary heat sink module of claim 1 wherein the cold plate heat exchanger comprises a micro-channel heat exchanger.

5. The unitary heat sink module of claim 1 wherein a cooling fluid used in the radiator heat exchanger, cold plate heat exchanger, and pump comprises water.

6. The unitary heat sink module of claim 1 wherein a cooling fluid used in the radiator heat exchanger, cold plate heat exchanger, and pump comprises a mixture of water and glycol.

7. The unitary heat sink module of claim 1 wherein a cooling fluid flows through the radiator heat exchanger, cold plate heat exchanger, and pump in a closed system without any phase change.

8. The unitary heat sink module of claim 1 wherein the overall dimensions of the liquid pump are about 1.5 inches in diameter and between 3.0 to 4.0 inches long.

9. The unitary heat sink module of claim 1 wherein the liquid pump comprises a brushless miniature spherical pumps a miniature diaphragm pump or a positive displacement pump.

10. The unitary heat sink module of claim 1, wherein the second thickness is in the range of about 2 to 5 millimeters.

11. The unitary heat sink module of claim 1, wherein the cold plate heat exchanger comprises an outer wall enclosing an interior space for receiving liquid from the cold liquid input line and wherein the first thickness is less than about 0.25 inches.

12. A field-replaceable unitary heat sink module employing active liquid cooling comprising:
   a heat sink casing;
   first and second radiator heat exchangers;
   first and second cold plate heat exchangers abutting a wall of the heat sink casing, wherein the first and second cold plate heat exchangers are fluidically connected to the first and second radiator heat exchangers, respectively; and
   first and second liquid pumps having electrical connections for receiving electrical pump power, wherein the first and second radiator heat exchangers, the first and second cold plate heat exchangers, and the first and second liquid pumps are physically coupled together to form a first and second closed active liquid cooling systems within the heat sink casing,
   wherein the first and second cold plate heat exchangers are embedded into the wall of the heat sink casing to reduce a thickness of the heat sink casing adjacent the first and second radiator heat exchangers from a first thickness to a second thickness.

13. The unitary heat sink module of claim 12 wherein the overall dimensions of the heat sink casing are about 5.0 inches by 3.0 inches by 1.75 inches.

14. The unitary heat sink module of claim 12 wherein the second thickness at the bottom of the heat sink casing proximate to the first and second cold plate heat exchangers is between about 2.0 and 5.0 mm.

15. The unitary heat sink module of claim 12 wherein the cold plate heat exchanger comprises a microchannel heat exchanger.

16. The unitary heat sink module of claim 12 wherein a cooling fluid used in the radiator heat exchanger, cold plate heat exchanger, and pump comprises water.

17. The unitary heat sink module of claim 12 wherein a cooling fluid used in the radiator heat exchanger, cold plate heat exchanger, and pump comprises a mixture of water and glycol.

18. The unitary heat sink module of claim 12 wherein a cooling fluid flows through the radiator heat exchanger, cold plate heat exchanger, and pump in a closed system without any phase change.

19. The unitary heat sink module of claim 12 wherein the liquid pump comprises a brushless miniature spherical pump, a miniature diaphragm pump or a positive displacement pump.

* * * * *